United States Patent [19]
Jacobs et al.

[11] Patent Number: 5,203,537
[45] Date of Patent: Apr. 20, 1993

[54] PIEZOCERAMIC VALVE ACTUATOR SANDWICH ASSEMBLY AND VALVE INCORPORATING SUCH AN ASSEMBLY

[75] Inventors: David C. Jacobs, Hampton; Joseph A. Hochadel, Yorktown, both of Va.

[73] Assignee: Teledyne Industries, Inc., Los Angeles, Calif.

[21] Appl. No.: 848,393

[22] Filed: Mar. 9, 1992

[51] Int. Cl.⁵ .................... F16K 31/02; H01L 41/08
[52] U.S. Cl. .................. 251/129.06; 310/330; 310/348; 251/368
[58] Field of Search ............... 251/129.06, 368; 310/330, 348

[56] References Cited

U.S. PATENT DOCUMENTS

| | | |
|---|---|---|
| 3,465,732 | 9/1969 | Kattchee . |
| 4,340,083 | 7/1982 | Cummins . |
| 4,356,423 | 10/1982 | Gudzin ..................... 310/348 X |
| 4,487,062 | 12/1984 | Olin et al. . |
| 4,487,213 | 12/1984 | Gates et al. . |
| 4,492,360 | 1/1985 | Lee, II et al. . |
| 4,508,127 | 4/1985 | Thurston . |
| 4,545,561 | 10/1985 | Brown . |
| 4,569,504 | 2/1986 | Doyle . |
| 4,610,426 | 9/1986 | Brandner . |
| 4,617,952 | 10/1986 | Fujiwara et al. . |
| 4,628,330 | 12/1986 | Suga et al. . |
| 4,658,855 | 4/1987 | Doyle . |
| 4,685,331 | 8/1987 | Renken et al. . |
| 4,687,020 | 9/1987 | Doyle . |
| 4,705,059 | 11/1987 | Lecerf et al. . |
| 4,718,443 | 1/1988 | Adney et al. . |
| 4,794,947 | 1/1989 | Kuramochi . |
| 4,809,730 | 3/1989 | Taft et al. . |
| 4,828,220 | 5/1989 | Hashimoto . |
| 4,903,732 | 2/1990 | Allen . |
| 4,921,005 | 5/1990 | Ohmi et al. . |
| 4,927,084 | 5/1990 | Brandner et al. . |
| 4,934,401 | 6/1990 | Ikehata et al. ............. 251/129.06 X |
| 4,947,889 | 7/1990 | Ishikawa et al. . |
| 4,952,836 | 8/1990 | Robertson ..................... 310/330 X |
| 4,977,916 | 12/1990 | Ohmi et al. . |
| 5,012,835 | 5/1991 | Ikehata et al. . |
| 5,029,610 | 7/1991 | Hiratsuka et al. . |

*Primary Examiner*—Arnold Rosenthal
*Attorney, Agent, or Firm*—Cushman, Darby & Cushman

[57] ABSTRACT

A piezoceramic valve includes a valve actuator sandwich assembly including a piezoceramic bending element flexibly bonded between two metal sheets. Flexible elastomeric sheets are bonded to outer surfaces of the metal sheets, respectively, to form the sandwich assembly. The valve includes a first supporting member which sealingly engages an outer surface of the first elastomeric sheet and a second supporting member which sealingly engages an outer surface of the second elastomeric sheet to flexibly support the valve actuator sandwich assembly between the two supporting members. The valve actuator is engageable with a valve seat to prevent flow through the valve and is deflectable away from the valve seat to allow flow through the valve. The piezoceramic bending element is isolated in the valve actuator sandwich assembly from the flow stream to prevent diffusion of low molecular weight gases through the porous ceramic and to isolate electrically active elements of the bending element from the flow stream.

17 Claims, 3 Drawing Sheets

PIEZOCERAMIC VALVE ACTUATOR SANDWICH ASSEMBLY AND VALVE INCORPORATING SUCH AN ASSEMBLY

BACKGROUND OF THE INVENTION

1. Field of the Invention

The present invention relates to a piezoceramic valve actuator sandwich assembly, and particularly, to a valve incorporating such an actuator.

2. Description of Related Art

Piezoceramic elements are elements in which the application of a voltage between certain faces of the piezoceramic element produces a mechanical distortion of the piezoceramic element. Piezoceramic valves incorporate a piezoceramic element in a valve actuator assembly and take advantage of the properties of the piezoceramic element to open and close a valve, thereby controlling gas and fluid flow through the valve.

Piezoceramic valves offer several advantages relative to electromagnetic valves. The primary advantage is that the piezoceramic valve converts only a small amount of power to wasted heat as compared to electromagnetic valves and therefore, consumes much less power. The power consumption of the piezoceramic valve may even be so low as to be negligible when compared to the required support circuitry.

In a conventional piezoceramic valve, a piezoceramic element is attached to a flexible metal substrate. The piezoceramic element can be of a unimorph type which has only a single piezoceramic layer, or a bimorph type which has two piezoceramic layers, one each attached to opposite sides of a flexible plate. Both types of piezoceramic elements are conventionally available. The piezoceramic element/substrate assembly is fixed to a valve body such that a portion of the assembly can cover and uncover a valve orifice in the valve body as the piezoceramic element is energized and deenergized, or vice-versa. The piezoceramic element/substrate assembly can be fixed to the valve body in the form of a cantilever beam or a diaphragm. In one known embodiment, as shown in U.S. Pat. No. 4,610,426, a circular piezoceramic element/substrate assembly operates as a diaphragm to cover a valve seat when the piezoceramic element is in a deenergized state and to deflect away from the valve seat to open the valve seat when the piezoceramic element is energized.

One problem with a conventional valve as shown U.S. Pat. No. 4,610,426, is that the sealing force of the piezoceramic valve actuator against the valve seat is limited due to the limited deflection force the piezoceramic bending element can generate. Therefore, the valve can only be used in low pressure situations, since higher pressures would merely push the valve actuator away from the valve seat, resulting in leakage. This leakage is best prevented by providing two valve chambers in the valve, one each isolated on opposing sides of the valve actuator diaphragm. The valve seat and orifice are provided in one of the chambers and the other chamber is exposed to the inlet pressure of the valve, thereby providing an equalizing pressure on the back side of the diaphragm that offsets the pressure on the diaphragm at the valve seat. Since the pressure on both the valve side and the back side of the diaphragm is equalized, only a small force is needed to seal the valve seat, even when the inlet pressure is relatively high.

Another problem with conventional piezoceramic valves is the isolation of the piezoceramic element from the gas or fluid flow through the valve. First, it is desirable to electrically insulate the electrically active piezoceramic element from the gas or fluid flow. Further, many gases and fluids are corrosive and the valve actuator must be insulated to provide protection from chemical attack. Additionally, low molecular weight gases, such as hydrogen or helium, are able to diffuse through the porous ceramic of the piezoceramic element, resulting in leakage of the gas through the valve. In a high pressure valve utilizing a normalizing back pressure chamber as described above, the piezoceramic element must be isolated from the gas or fluid flow not only its valve side but also on its back side. This must be done while providing a mounting for the diaphragm that not only sealingly isolates the piezoceramic element from the gas or fluid, but also provides enough flexibility for the diaphragm to deflect and operate properly.

SUMMARY OF THE INVENTION

It is an object of the present invention to provide a piezoceramic valve actuator assembly for use in a valve that offers the advantages of a piezoceramic valve actuator but that can be utilized under adverse conditions, including high pressure operation, explosive and corrosive gas and fluid flow, and low molecular weight gas flow.

It is a further object of the present invention to provide a valve utilizing such a piezoceramic valve actuator assembly.

A piezoceramic valve actuator sandwich assembly according to the present invention includes a piezoceramic bending element having a first side and a second side and includes means for electrically activating the piezoceramic bending element. First and second metal sheets are flexibly bonded to the first and second sides of the piezoceramic bending element, respectively. First and second flexible elastomeric sheets are bonded to outer surfaces of the first and second metal sheets, respectively.

A valve according to the present invention and including a piezoceramic valve actuator sandwich assembly as described above further includes a first supporting member which sealingly engages an outer surface of the first elastomeric sheet in a continuous line around a periphery of a central portion of the first elastomeric sheet to flexibly support a first side of the valve actuator sandwich assembly and to create a first valve chamber between the central portion of the elastomeric sheet and the first supporting member. A second supporting member sealingly engages an outer surface of the second elastomeric sheet in a continuous line around a periphery of a central portion of the second elastomeric sheet to flexibly support a second side of the valve actuator sandwich assembly. The provision of the elastomeric sheets on the valve actuator sandwich assembly allows this flexible but sealed mounting without the necessity of additional components in the valve itself.

A valve inlet and a valve outlet are communicable with the first chamber and one of the inlet and outlet includes a valve orifice which is sealing engageable with the central portion of the first elastomeric sheet to prevent a stream of flow through the valve orifice, first chamber, valve inlet and valve outlet. The valve orifice is also disengageable from the first elastomeric sheet to allow the stream of flow through the valve orifice, first chamber, valve inlet and valve outlet.

The flexible supporting of the valve actuator sandwich assembly by the first and second supporting member allows deflection of the valve actuator sandwich assembly when the piezoceramic bending element is actuated. The sealing engagement of the first and second supporting members with the first and second elastomeric sheets, respectively, also causes a sealing engagement between the first and second elastomeric sheets and the first and second metal sheets, respectively, and thereby isolates the piezoceramic bending element from the flow stream.

Other features and advantages of the present invention will be apparent from the following description of the preferred embodiment, taken in conjunction with the accompanying drawings, claims and abstract, all of which form part of this specification, wherein like reference numerals designate corresponding parts in the various figures.

DETAILED DESCRIPTION OF THE PREFERRED EMBODIMENT

Figure 1:
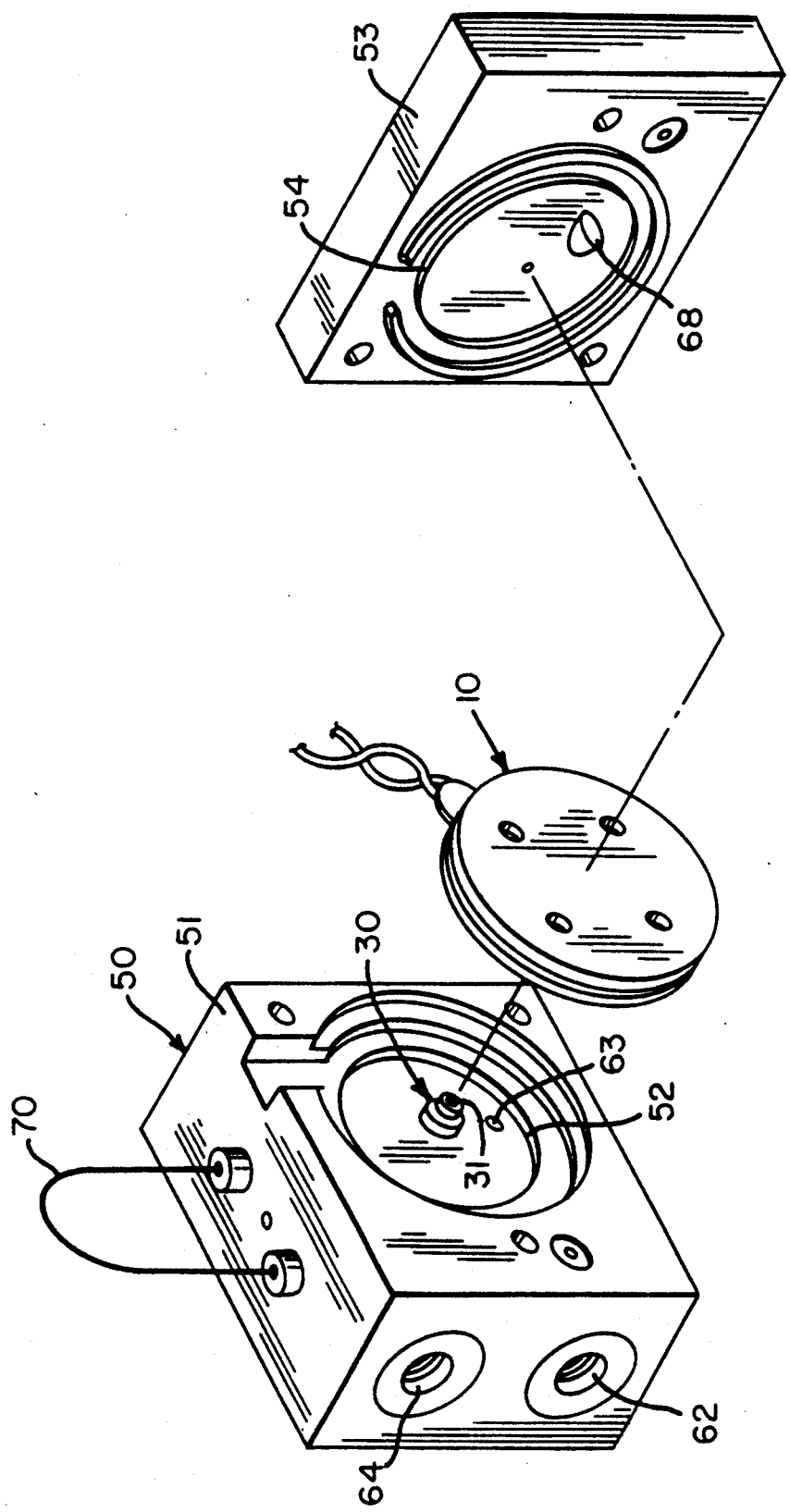
FIG. 1 is an exploded view of a mass flow controller utilizing a piezoceramic valve according to the present invention.
Figure 3:
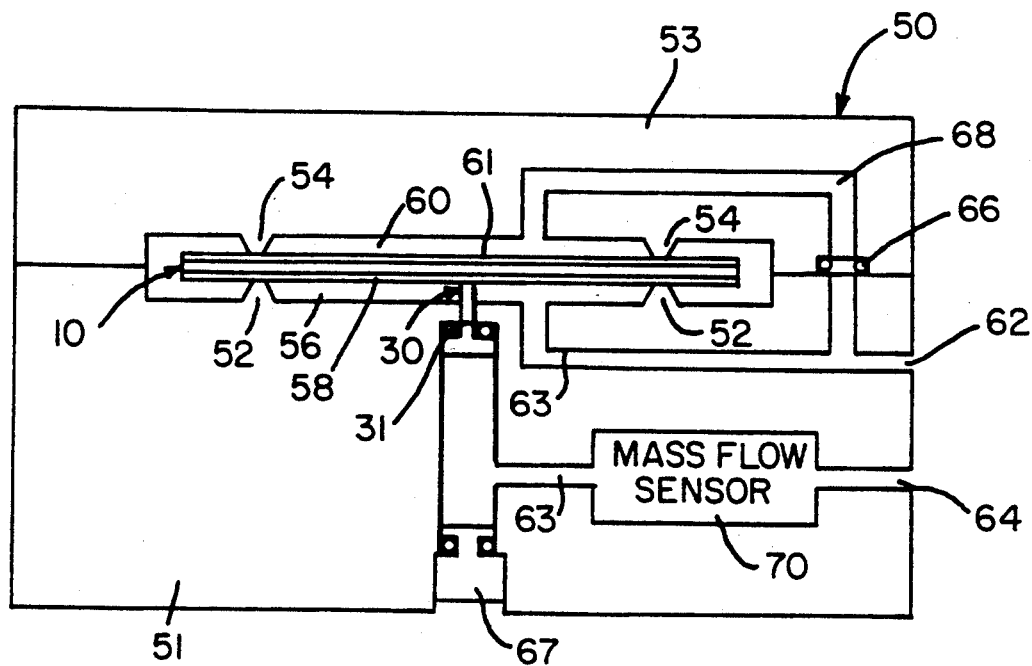
FIG. 3 is a partially schematic sectional view of the mass flow controller of FIG. 1.

FIGS. 1 and 3 show a piezoceramic valve 50 having a first housing portion 51 and a second housing portion 53. The valve 50 further includes a valve seat 30 and a piezoceramic valve actuator sandwich assembly 10.

Figure 2:
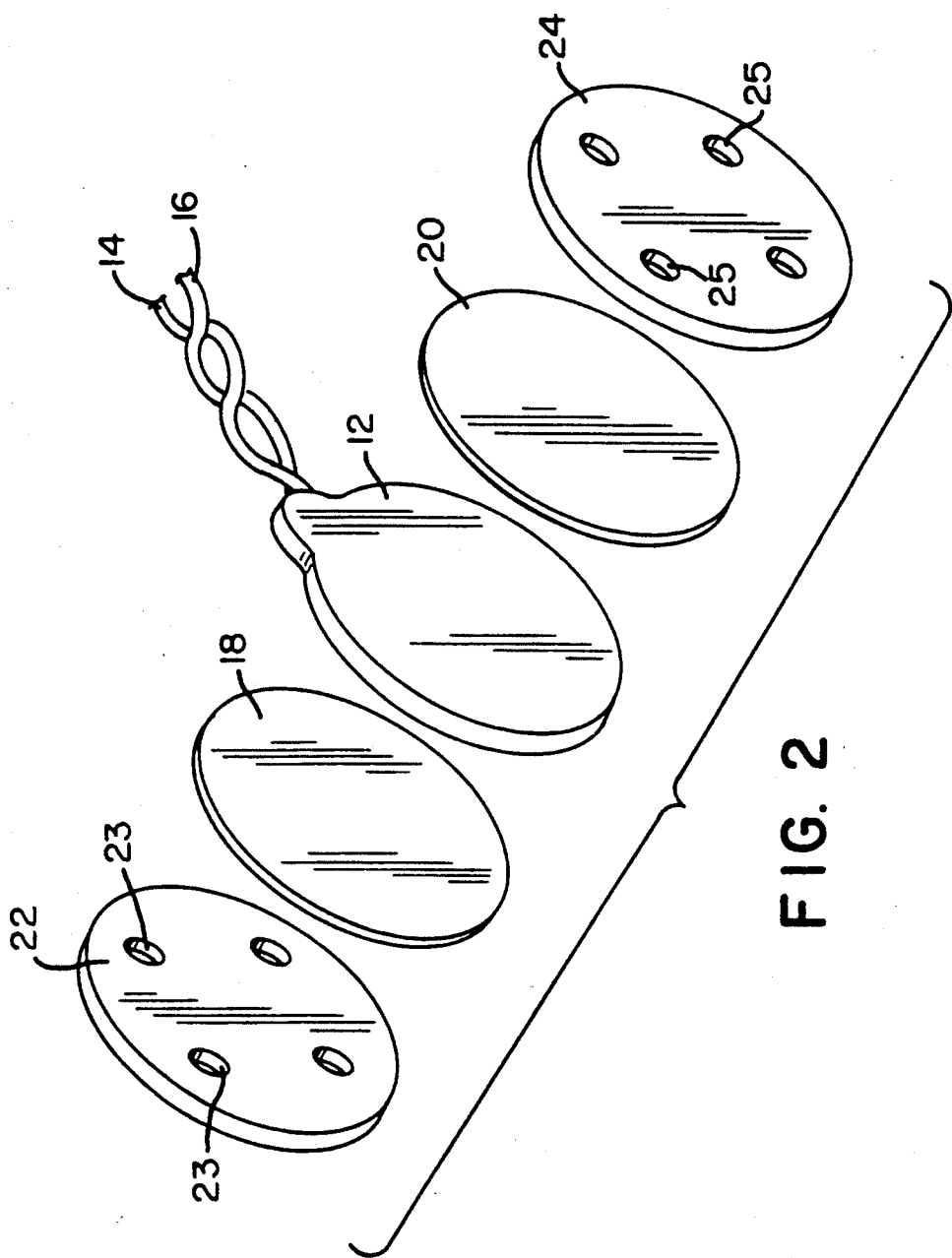
FIG. 2 is an exploded view of a piezoceramic valve actuator sandwich assembly according to the present invention.

As shown in FIG. 2, the piezoceramic valve actuator sandwich assembly 10 comprises a piezoceramic bending element 12 which includes leads 14 and 16 for connection to an electrical supply for electrically activating the piezoceramic bending element 12. The piezoceramic bending element 12 is in the form of a generally circular disc and can be of a unimorph or a bimorph type as is commonly available from known piezoceramic suppliers. In the preferred embodiment, a Motorola bimorph bending element, part no. KSN1154ENG is used.

A first metal sheet 18 and a second metal sheet 20 are each bonded to opposing sides of the piezoceramic bending element 12 with a layer of adhesive (not shown) which provides a fluid, flexible connection between the piezoceramic bending element 12 and the metal sheets 18 and 20. The two layers of adhesive further act to electrically insulate the electrically active piezoceramic bending element 12 from the flow stream. Metal sheets 18 and 20 prevent the diffusion of low molecular weight gases through the porous ceramic of the piezoceramic bending element 12. In the preferred embodiment, the metal sheets 18 and 20 are also both in the form of a disc, approximately 1 mil thick each, and are constructed of stainless steel. In the preferred embodiment, 3M adhesive, no. 467 in sheet form is used with each adhesive layer being approximately 2 mils thick. The sandwich assembly is approximately 1.25 inches in diameter. Other shapes, dimensions and materials can also be used.

A first elastomeric sheet 22 and a second elastomeric sheet 24 are bonded to outer surfaces of the first and second metal sheets, respectively. The elastomeric sheets 22 and 24 substantially cover the metal sheets 18 and 20, respectively, and provide both a flexible mounting surface for mounting the piezoceramic valve actuator sandwich assembly 10 in the piezoceramic valve 50 and a flexible sealing surface for sealing against the valve seat 30 of the valve 50. In the preferred embodiment, each disc-shaped elastomeric sheet is approximately 0.032 inch thick and is constructed of Viton. Each sheet is bonded to its respective metal sheet with a 0.25 inch patch of adhesive centered on the sheet. The adhesive can be the same adhesive used to bond the metal sheets to the bending element or it can be different. Alternative methods of bonding can be used such as chemical bonding or mechanical bonding. Alternatively, the elastomeric sheets can be constructed of neoprene, Buna-N or other elastomeric materials.

Elastomeric sheets 22 and 24 are each provided with a plurality of vents 23 and 25, respectively, to allow low molecular weight gas to escape from between the elastomeric sheets and the metal discs. Without the vents 23 and 25, it is possible for this gas to diffuse through the elastomeric sheets 22 and 24, build up between the elastomeric sheets and the metal sheets and cause the elastomeric sheets to balloon away from the metal sheets, which could prevent the proper performance of the valve actuator.

As seen in FIGS. 1 and 3, the piezoceramic valve actuator sandwich assembly 10 is flexibly mounted in the valve 50 between a first supporting member 52 and a second supporting member 54. In the preferred embodiment, the two supporting members are both in the form of continuous circles of same dimension directly opposite each other. Alternatively, the supporting members could be of a different shape and need not be identically dimensioned.

As best seen in FIG. 3, the piezoceramic valve actuator sandwich assembly is clamped between the first supporting member 52 and the second supporting member 54 with the protruding tips of the supporting members 52 and 54 flexibly but sealingly engaging the elastomeric sheets 22 and 24 of the piezoceramic valve actuator sandwich assembly 10. This sealing engagement also isolates the exposed exterior edge of the sandwich assembly 10 and the electrical leads 14 and 16 away from the flow stream.

The engagement of the supporting members 52 and 54 with the piezoceramic valve actuator sandwich assembly 10 is at a periphery of a central portion 58 and 61 of each side of the sandwich assembly 10 and not at an outer periphery of the sandwich assembly 10. By supporting the sandwich assembly 10 inwardly from its outer periphery, the sandwich assembly can pivot at the supporting line with the portion of the sandwich assembly outside of the supporting members pivoting in a direction opposite that of the portion of the sandwich assembly inside of the supporting members. This can be seen in FIG. 4(b) where the portion of the sandwich assembly outside of the supporting members moves downward when the portion of the sandwich assembly inside of the supporting members is deflected upward. This inboard supporting also provides a better seal than attempting to seal at an outer periphery of the sandwich assembly.

In the preferred embodiment the supporting members are triangularly shaped in section but alternatively, can be shaped with rounded or flattened tips. Thus, the flexible mounting allows the piezoceramic valve actuator sandwich assembly 10 to deflect when electrically activated while maintaining a gas and fluid tight seal between the piezoceramic valve actuator sandwich assembly 10 and the supporting members 52 and 54.

The engagement of the piezoceramic valve actuator sandwich assembly 10 with the first supporting member 52 creates a first valve chamber 56 between the central portion 58 of the sandwich assembly 10 and the supporting member 52. Likewise, a second chamber 60 is created between the central portion 61 of the sandwich assembly 10 and the supporting member 54. The first valve chamber is communicable with both a valve inlet 62 and a valve outlet 64. The valve seat 30 is positioned in the flow path 63 between the valve inlet 62 and the valve outlet 64 to be engageable with and disengageable from the piezoceramic valve actuator sandwich assembly 10 as the sandwich assembly 10 is deactivated and activated, respectively, or vice-versa. Thus, the valve can be a normally open or a normally closed valve.

Figure 4A:
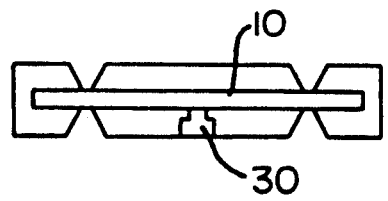
FIGS. 4(a) and 4(b) are schematic views showing the operation of the piezoceramic valve actuator sandwich assembly according to the present invention.
Figure 4B:
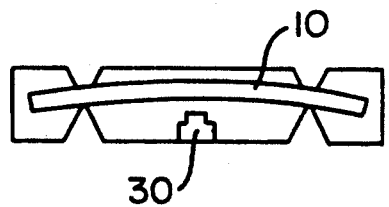

In the preferred embodiment, as seen in FIG. 4(a), the sandwich assembly 10 engages the valve seat 30 in a deactivated state to seal against the valve seat 30 and prevent flow through orifice 31 of valve seat 30 and hence, valve 50. As seen in FIG. 4(b), the sandwich assembly deflects away from the valve seat 30 in an activated state to allow flow through the orifice 31 and hence, valve 50. Further, the valve seat 30 is adjustable as to height to provide a proper sealing engagement with the elastomeric sheet of the piezoceramic valve actuator sandwich assembly 10 when the sandwich assembly 10 is in a deactivated state. This can be accomplished by threading the valve seat 30 into the valve 50. Access plug 67 is provided in the valve 50 to adjust the height of valve seat 30.

The inlet 62 is in communication with the first valve chamber when the valve is closed so that the diameter of the valve orifice does not significantly effect the pressure on the valve side of the sandwich assembly. Alternatively, the inlet 62 and outlet 64 could be reversed so that the inlet 62 is not in communication with the first valve chamber when the valve is closed.

The second chamber 60 is also communicable with the valve inlet 62 to provide an equalizing back pressure against a back side of the sandwich assembly 10 to offset the inlet pressure on the valve seat side of the sandwich assembly 10. O-ring 66 between housing portions 51 and 53 seals passageway 68 from valve inlet 62 to the second chamber 60. Thus, the valve 50 is able to effectively handle high pressure applications which would otherwise prove too powerful for the limited deflection force of the piezoceramic bending element 12. Alternatively, in low pressure applications, the back pressure function of the second chamber can be deleted.

Thus, a valve 50 according to the present invention isolates all elements of the actuator assembly having electrical potential from both a flow stream and a back pressure stream while preventing diffusion and leakage of low molecular weight gases through the porous piezoceramic bending element.

Further, the valve 50 is easily converted to a mass flow controller for continuous variable control of a flow stream by providing a mass flow sensor 70 in the flow stream 63 between valve inlet 62 and outlet 64. The mass flow sensor 70 and any control circuitry can be of conventional design, as long as the proper excitation voltage is applied to the piezoceramic bending element 12 for desired operation. In the preferred embodiment, the mass flow sensor 70 is placed downstream of valve seat 30. This allows orifice 31 in valve seat 30 to act as a choke and dampen supply pressure fluctuations, thereby making the mass flow sensor 70 less sensitive to these fluctuations. Alternatively, the mass flow sensor 70 can be placed upstream of the valve seat 30.

The mass flow controller operates as follows, with the assumption that inlet pressure is greater than outlet pressure. With no power applied to the control circuit, the piezoceramic valve actuator sandwich assembly 10 assumes its natural deactivated flat state and with the valve seat 30 adjusted properly, prevents flow through the valve orifice 31 and hence, the mass flow controller. Upon power-up, with demand for flow present, the mass flow sensor 70 will cause a DC voltage to be applied across leads 14 and 16 of piezoceramic bending element 12, causing the bending element 12 to deflect away from valve seat 30, with a displacement proportional to the voltage applied. With the establishment of flow, the mass flow sensor 70 will cause the DC voltage to be adjusted until the flow signal is equal to a demand signal.

While the invention has been described in accordance with what is presently conceived to be the most practical and preferred embodiments, it is to be understood that the invention is not limited to the disclosed embodiments but on the contrary, is intended to cover various modifications and equivalent arrangements included within the spirit and scope of the appended claims, which scope is to be accorded the broadest interpretation of such claims so as to encompass all such equivalent structures.

What is claimed is:

1. A valve comprising:
   a valve actuator sandwich assembly comprising;
   a piezoceramic bending element having a first side and a second side and including means for electrically activating the piezoceramic bending element;
   first and second metal sheets flexibly bonded to the first and second sides of the piezoceramic bending element, respectively;
   first and second flexible elastomeric sheets bonded to outer surfaces of the first and second metal sheets, respectively;
   a first supporting member which sealingly engages an outer surface of the first elastomeric sheet in a continuous line around a periphery of a central portion of the first elastomeric sheet to flexibly support a first side of the valve actuator sandwich assembly and to create a first valve chamber between the central portion of the elastomeric sheet and the first supporting member;
   a second supporting member which sealingly engages an outer surface of the second elastomeric sheet in a continuous line around a periphery of a central portion of the second elastomeric sheet to flexibly support a second side of the valve actuator sandwich assembly;
   a valve inlet communicable with the first chamber;
   a valve outlet communicable with the first chamber; and
   at least one of the valve inlet and the valve outlet including a valve seat having an orifice therethrough sealingly engageable with the central portion of the first elastomeric sheet to prevent a stream of flow through the valve seat, first chamber, valve inlet and valve outlet, the valve seat being disengageable from the first elastomeric sheet to allow the stream of flow through the valve seat, first chamber, valve inlet and valve outlet;

wherein the flexible supporting of the valve actuator sandwich assembly by the first and second supporting members allows deflection of the valve actuator sandwich assembly when the piezoceramic bending element is actuated; and the sealing engagement of the first and second supporting members with the first and second elastomeric sheets, respectively, also causes a sealing engagement between the first and second elastomeric sheets and the first and second metal sheets, respectively, and thereby isolates the piezoceramic bending element from the flow stream.

2. A valve as in claim 1 wherein the valve seat engages the first elastomeric sheet when the piezoceramic element is activated.

3. A valve as in claim 1 wherein the valve seat disengages the first elastomeric sheet when the piezoceramic element is activated.

4. A valve as in claim 1 wherein the metal sheets prevent diffusion of low molecular weight gases through the porous piezoceramic bending element.

5. A valve as in claim 1 wherein at least one of the elastomeric sheets is constructed of viton.

6. A valve as in claim 1 wherein at least one of the elastomeric sheets includes at least one vent in its central portion to prevent a build up of gas between the elastomeric sheet and the metal sheet.

7. A valve as in claim 1 wherein the continuous sealing lines are circular.

8. A valve as in claim 1 wherein the valve seat is adjustable as to engagement with the first elastomeric sheet.

9. A valve as in claim 1 wherein the metal sheets are flexibly bonded to the piezoceramic bending element with a layer of adhesive that allows proper flexing of the piezoceramic element and which additionally, electrically insulates electrically active elements of the piezoceramic bending element from the flow stream.

10. A valve as in claim 1 wherein an outer periphery of the valve actuator sandwich assembly located outside of the continuous sealing lines is deflectable as the piezoceramic bending element is activated and deactivated.

11. A valve as in claim 1 wherein the means for electrically activating the piezoceramic bending element is electrically isolated from the flow stream by the sealing engagement between the supporting members, the elastomeric sheets, and the metal sheets.

12. A valve as in claim 1 wherein the sealing engagement between the second supporting member and the second elastomeric sheet creates a second valve chamber which is communicable with the valve inlet to pressurize the second valve chamber and thereby, more equally balance pressure on the first and second sides of the valve actuator sandwich assembly.

13. A valve as in claim 1 wherein the two continuous sealing lines are directly opposite each other.

14. A valve as in claim 1 wherein the two continuous sealing lines are not directly opposite each other.

15. A valve as in claim 1 in combination with a mass flow sensor.

16. A combination as in claim 15 wherein the mass flow sensor is positioned in a flow path of the valve downstream of the valve seat.

17. A valve actuator sandwich assembly, comprising:
a piezoceramic bending element having a first side and a second side and including means for electrically activating the piezoceramic bending element;
first and second metal sheets flexibly bonded to the first and second sides of the piezoceramic bending element, respectively; and
first and second flexible elastomeric sheets bonded to outer surfaces of the first and second metal sheets, respectively.

* * * * *